United States Patent
Botma

(10) Patent No.: US 8,030,628 B2
(45) Date of Patent: *Oct. 4, 2011

(54) PULSE MODIFIER, LITHOGRAPHIC APPARATUS AND DEVICE MANUFACTURING METHOD

(75) Inventor: Hako Botma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 274 days.

This patent is subject to a terminal disclaimer.

(21) Appl. No.: 12/324,218

(22) Filed: Nov. 26, 2008

(65) Prior Publication Data

US 2009/0159819 A1 Jun. 25, 2009

Related U.S. Application Data

(60) Provisional application No. 60/996,992, filed on Dec. 13, 2007.

(51) Int. Cl.
*G03R 23/02* (2006.01)
*H01L 3/13* (2006.01)

(52) U.S. Cl. ............ 250/504 R; 250/503.1; 250/227.12; 250/493.1; 372/30; 372/25; 372/700; 398/161

(58) Field of Classification Search .............. 250/504 R, 250/227.12, 503.1, 493.1; 372/30, 25, 700; 398/161

See application file for complete search history.

(56) References Cited

U.S. PATENT DOCUMENTS

| 5,656,882 | A | 8/1997 | Lazarus et al. |
| 7,326,948 | B2 * | 2/2008 | Botma ........................ 250/578.1 |
| 7,432,517 | B2 * | 10/2008 | Botma et al. .............. 250/504 R |
| 7,714,986 | B2 * | 5/2010 | Visser et al. ..................... 355/67 |
| 2007/0090278 | A1 | 4/2007 | Botma |
| 2010/0163757 | A1 * | 7/2010 | Joobeur et al. ............ 250/504 R |

FOREIGN PATENT DOCUMENTS

| JP | 2000-244036 A | 9/2000 |
| JP | 2005-502208 A | 1/2005 |
| JP | 2006-148115 A | 6/2006 |
| JP | 2007-052428 A | 3/2007 |

OTHER PUBLICATIONS

English language Abstract of Japanese Patent Publication No. 2000-24436 A, Japanese Patent Office, published Sep. 8, 2000; 1 page.
English language Abstract of Japanese Patent Publication No. 2006-148115 A, Japanese Patent Office, published Jun. 8, 2006; 1 page.
English language Abstract of Japanese Patent Publication No. 2007-052428 A, Japanese Patent Office, published Mar. 1, 2007; 1 page.
English translation of Japanese Notice of Reasons for Rejection directed to related Japanese Patent Application No. 2008-312093, Japanese Patent Office, mailed May 6, 2011; 2 pages.

* cited by examiner

*Primary Examiner* — Nikita Wells
(74) *Attorney, Agent, or Firm* — Sterne, Kessler, Goldstein & Fox P.L.L.C

(57) ABSTRACT

A pulse modifier, and associated lithographic apparatus and a method for manufacturing a device, is disclosed. The pulse modifier is configured to receive an input pulse of radiation and further configured to emit a plurality of corresponding output pulse portions of radiation, wherein the respective pulse portions are respectively mirrored about an axis transverse to the optical axis and mirrored about a point of the optical axis of the pulse portions.

16 Claims, 6 Drawing Sheets

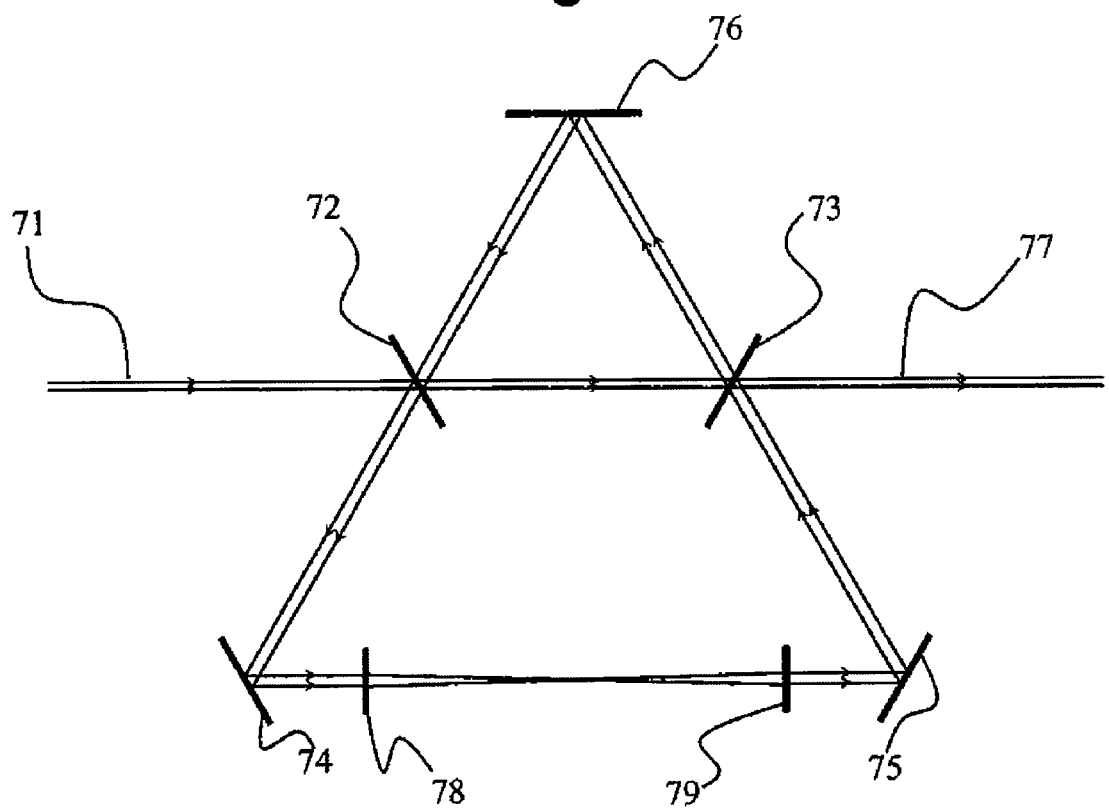

PULSE MODIFIER, LITHOGRAPHIC APPARATUS AND DEVICE MANUFACTURING METHOD

CROSS-REFERENCE TO RELATED APPLICATION

This application claims priority to U.S. Application 60/996,992 filed on Dec. 13, 2007. The subject matter of that application is incorporated herein by reference as if fully set forth herein.

BACKGROUND

1. Field of Invention

The present invention relates to a pulse modifier, a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus typically comprises large expensive optical elements that are difficult to fabricate. Typically, an excimer laser is used to supply the lithographic apparatus with a radiation beam in the form of pulses. The optical elements are subject to degradation resulting from billions of these high intensity ultraviolet pulses. Optical damage is known to increase with increasing intensity (i.e., light power (energy/time) per $cm^2$ or $mJ/ns/cm^2$) of the pulses from the laser. The typical pulse length from these lasers is about 20 ns, so a 5 mJ laser pulse would have a pulse power intensity of about 0.25 mJ/ns (0.25 MW). Increasing the pulse energy to 10 mJ without changing the pulse duration would result in a doubling of the power of the pulses to about 0.5 mJ/ns, which could significantly shorten the usable lifetime of the optical elements.

Furthermore, in order to accurately reproduce the pattern of patterning device onto a target portion of a substrate, the radiation beam produced by the laser should be well defined, having substantially constant and predictable properties. The radiation beam should be substantially symmetrical in shape and have a substantially uniform intensity distribution. In practice, no perfectly symmetrical and/or uniform radiation beam is obtainable. For instance, the Cymer XLA-165 laser is known to produce a radiation beam having a constant contour (due to a rectangular diaphragm inside the laser), but have a fluctuating and asymmetric intensity distribution of the radiation beam cross-section. This results in unstable measurements of radiation beam positioning and pointing. High-power lasers in general do not have a constant and symmetric intensity profile—the profile changes in time, e.g., due to laser refills or gas heating or gas burn-up.

A beam modifying configuration has been proposed in U.S. patent application publication no. 2007-0090278 for use with a lithographic apparatus. In that application, the problem of optical damage may be avoided by increasing substantially the pulse length of the pulses of the radiation beam. Furthermore, the problem of inaccurate transfer of the pattern of the patterning device onto a target portion on the substrate due to an asymmetric intensity distribution of the radiation beam cross-section may be reduced by combining delayed copies of the original beam intensity distribution with delayed mirrored copies of the original beam intensity distribution into an output radiation beam (in which mirrored is meant as being mirrored simultaneously in the horizontal as well as in the vertical plane). In this way, an asymmetric intensity distribution of the radiation beam cross-section may be reduced to a certain extent.

A possible disadvantage of a beam modifying configuration as proposed in U.S. patent application publication no. 2007-0090278 is that the asymmetric intensity distribution of the radiation beam cross-section may not be sufficiently reduced. Additional or alternative disadvantages may be a high sensitivity of the outcoming radiation beam quality to the incoming beam divergence and a high sensitivity to alignment of the optical components to each other and to the incoming radiation beam.

It is desirable, for example, to provide a pulse modifier that reduces the changes to the characteristics of the incoming radiation beam.

SUMMARY

According to an aspect of the invention, there is provided a pulse modifier configured to receive an input pulse of radiation and further configured to emit one or more corresponding output pulses of radiation. The pulse modifier includes a beam divider for dividing the input pulse into a plurality of pulse portions, a plurality of delay paths for receiving and delaying the respective pulse portions, and a beam combiner for combining the delayed pulse portions into the one or more output pulses. At least one delay path is arranged to mirror a portion of a cross-section of the pulse portion about a first axis transverse to the optical axis of the pulse portions and at least a further delay path is arranged to mirror a portion of a cross-section of the pulse portion about a point of the optical axis of the pulse portions.

In an embodiment, the pulse modifier is configured to receive the input pulse of radiation along a first optical axis and further configured to emit the one or more corresponding output pulses of radiation along a second optical axis. The beam divider includes a first beam splitter disposed along the first optical axis and a second beam splitter disposed along the second optical axis, wherein a first delay path is configure to originate at the first beam splitter and terminate at the second beam splitter. A second delay path is configured to originate at the second beam splitter and terminate at the first beam splitter. The first beam splitter is configured to divide the input pulse into a first and a second pulse portion. The first beam splitter is configured to direct the first pulse portion along the second optical axis and the second pulse portion along the first delay path. The second beam splitter is configured to divide the first pulse portion into a third and a fourth pulse portion and to divide the second pulse portion into a fifth and a sixth pulse portion. The second beam splitter is configured to direct the third and fifth pulse portions along the second optical axis and the fourth and sixth pulse portions along the second delay path. The first beam splitter is configured to divide pulses from the fourth and sixth pulse portions into a seventh and a eighth pulse portion. The first beam splitter is configured to direct the seventh pulse portion along the second optical axis and to direct the eighth pulse portion along the first delay path. The first or the second delay path is arranged to mirror a portion of a cross-section of the pulse portion about a first axis transverse to the optical axis of the pulse portions and at least a second delay path is arranged to mirror a portion of a cross-section of the pulse portion about a point of the optical axis of the pulse portions.

In an embodiment, the first optical axis coincides with the second optical axis.

In an embodiment, the first or the second delay path comprises a first and second mirror and the other of the first or the second delay comprises a third mirror.

In an embodiment, the first and second mirrors are concave mirrors and the third mirror is a plane mirror.

In an embodiment, the first and second mirrors have a first radius of curvature in a first direction and a second radius of curvature in a second direction.

In an embodiment, the first radius of curvature is equal to the second radius of curvature.

In an embodiment, the first delay path comprises a first and a second mirror and the second delay path comprises a third and a fourth mirror.

In an embodiment, the first and second mirrors or the third and fourth mirrors are cylindrical mirrors.

In an embodiment, a wavelength of radiation is selected from one of the following: 365 nm, 355 nm, 248 nm, 193 nm, 157 nm, 126 nm and in the range 5-20 nm.

In an embodiment, the wavelength of radiation is 193 nm and the first and second beam splitters are substantially made of $CaF_2$.

According to an aspect of the invention, there is provided a lithographic apparatus comprising a pulse modifier according to various embodiments of the invention.

In an embodiment, the pulse modifier is arranged in an illumination system or beam delivery system of the lithographic apparatus.

According to an aspect of the invention, there is provided a method of modifying an input pulse of radiation. The method includes: receiving an input pulse of radiation; dividing the input pulse into a plurality of pulse portions; delaying the plurality of pulse portions; combining the delayed pulse portions into one or more output pulses of radiation; mirroring a portion of a cross-section of the pulse portion about a first axis transverse to the optical axis of the pulse portions using a delay path; and mirroring a portion of a cross-section of the pulse portion about a point of the optical axis of the pulse portions using a further delay path.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 shows a pulse modifier according to an embodiment of the invention.

DETAILED DESCRIPTION

Figure 1:
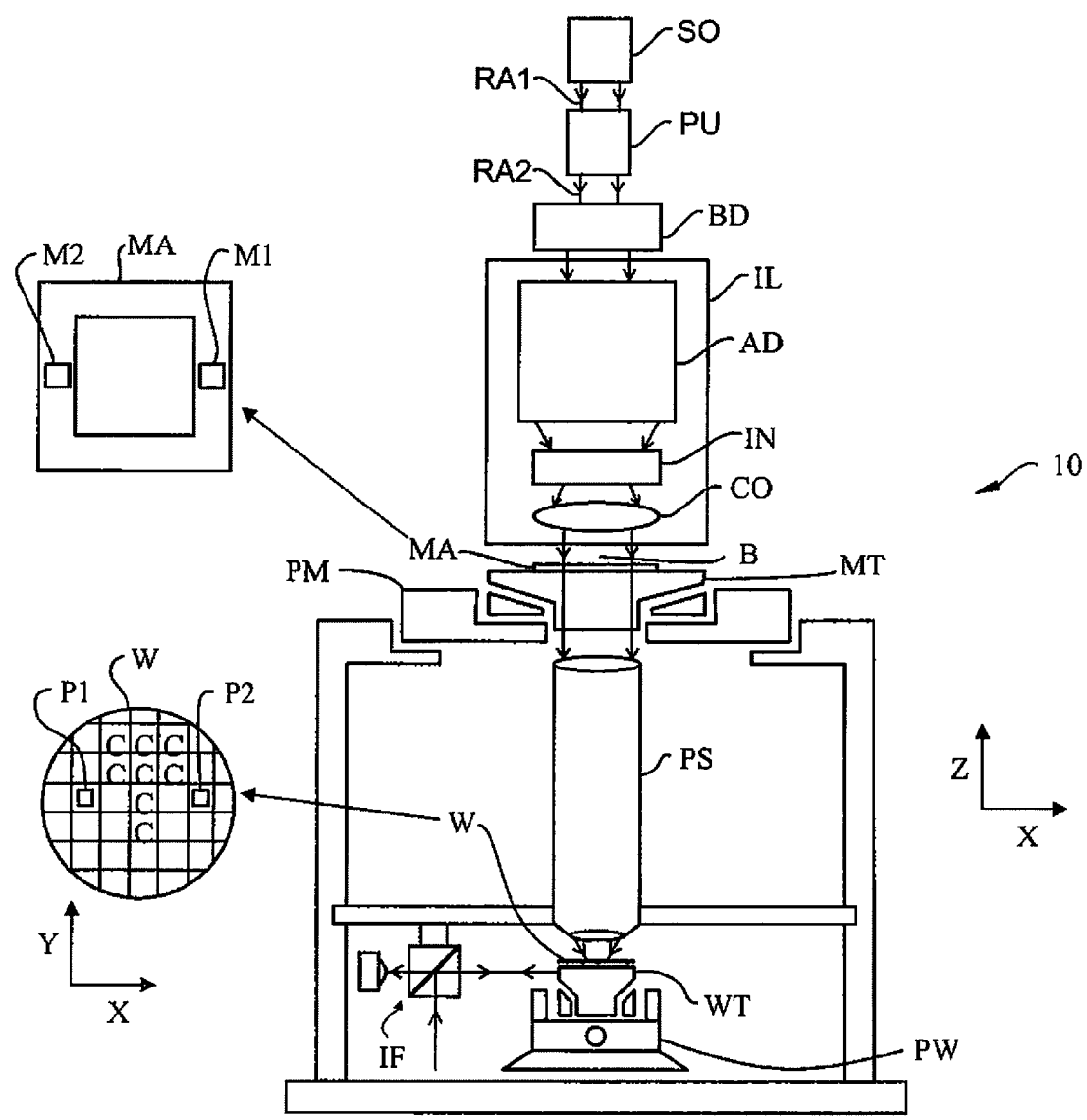
FIG. 1 shows a lithographic apparatus according to an embodiment of the invention.

FIG. 1 schematically depicts a lithographic apparatus 10 according to one embodiment of the invention. An illuminator IL is configured to condition a radiation beam B (e.g., UV radiation or DUV radiation), and is further configured to receive radiation from a source SO via a beam delivery system BD. At some point between the source SO and the illuminator IL, the radiation passes through a pulse modifier PU which conditions the radiation for use in the lithographic apparatus. A support structure (e.g. a mask table) MT is constructed and arranged to support a patterning device (e.g. a mask) MA and is connected to a first positioner PM configured to accurately position the patterning device in accordance with certain parameters. A substrate table (e.g. a wafer table) WT is constructed and arranged to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The division of the radiation path before the patterning device into a source SO, pulse modifier PU, beam delivery BD and illuminator IL is somewhat arbitrary—it can be related to technical features or it can be related to the fact that parts and units are supplied by different manufacturers. For example, the source SO, pulse modifier PU and lithographic apparatus may be supplied by different manufacturers (as is currently the practice in the case of a laser source) or the source SO and pulse modifier PU may be integrated within the lithographic apparatus. For convenience, the term "illumination system" will be used to describe the collection of parts and units disposed in the optical path before the patterning device and after the source—in the example of FIG. 1, the illumination system would thus comprise the pulse modifier PU, the beam delivery BD and the illuminator IL.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Figure 2A:
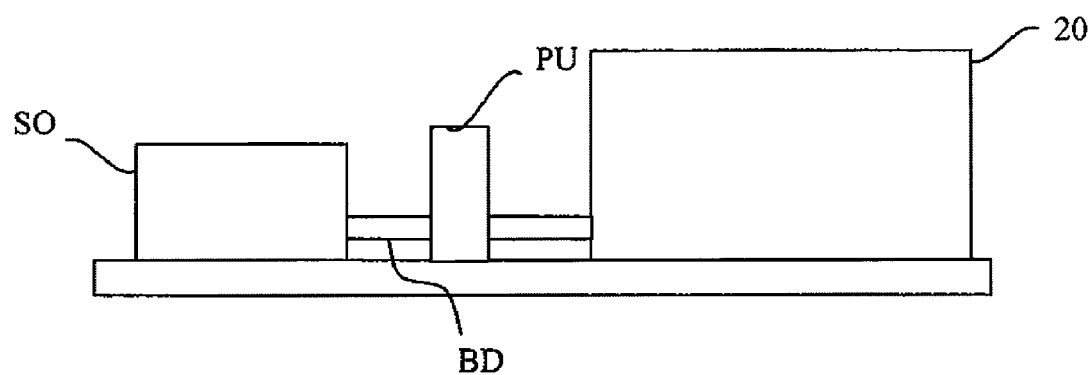
FIGS. 2a and 2b show arrangements of the lithographic apparatus according to an embodiment of the invention.

Referring to FIG. 1, the pulse modifier PU receives a radiation beam RA1 from a radiation source SO. As already mentioned, the radiation source SO, pulse modifier PU and the lithographic apparatus each may be separate entities. FIG. 2a shows such an arrangement, wherein the radiation source SO, pulse modifier PU and the lithographic apparatus 20 are arranged on the same floor in a manufacturing facility. In this case, the source is not considered to form part of the lithographic apparatus 20 and the radiation beam is passed from the source SO, via the pulse modifier PU to the illuminator IL with the aid of a beam delivery system BD comprising, for example, suitable directing mirrors and/or a beam expander.

Figure 2B:
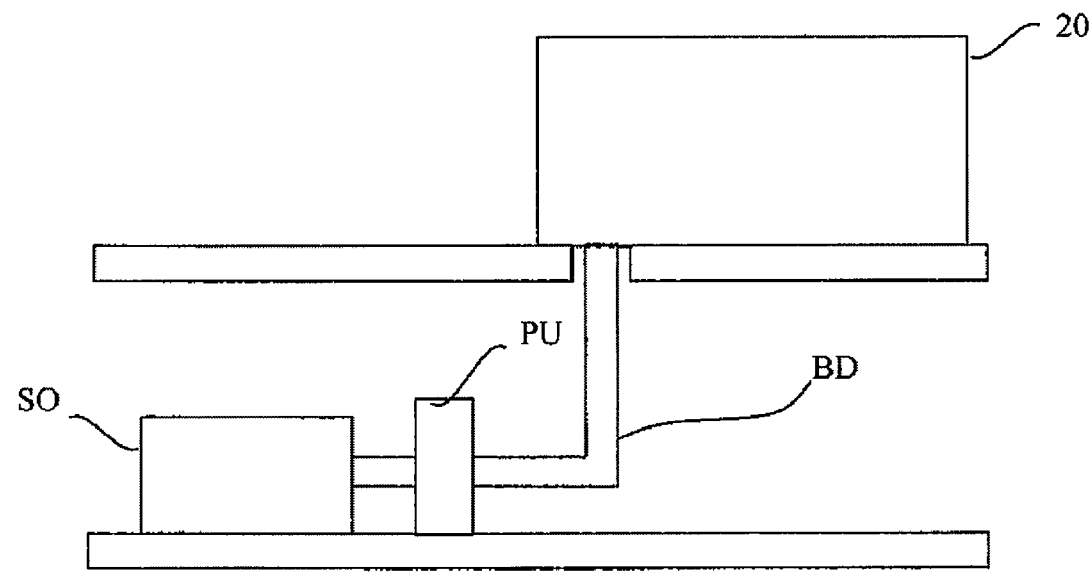

The arrangement shown in FIG. 2b offers the flexibility of placing the source SO, pulse modifier PU and the lithographic apparatus 20 in separate rooms. Typically the lithographic apparatus 20 is placed inside a clean-room wherein considerable effort is spent keeping the ambient number of particles low, and the source SO and pulse modifier PU are placed in a service area where cleanliness is maintained to a much lower degree. As shown in FIG. 2b, it is even possible to use a lower floor as a service area, and to place the source SO there. Alternatively, the pulse modifier PU may be integrated in the lithographic apparatus 20 or in the source SO. During operation, the pulse modifier PU receives an incoming pulse RA1, and divides it into one or more output pulses RA2, with peak intensities which are lower than the peak intensity of the incoming pulse RA1.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 3:
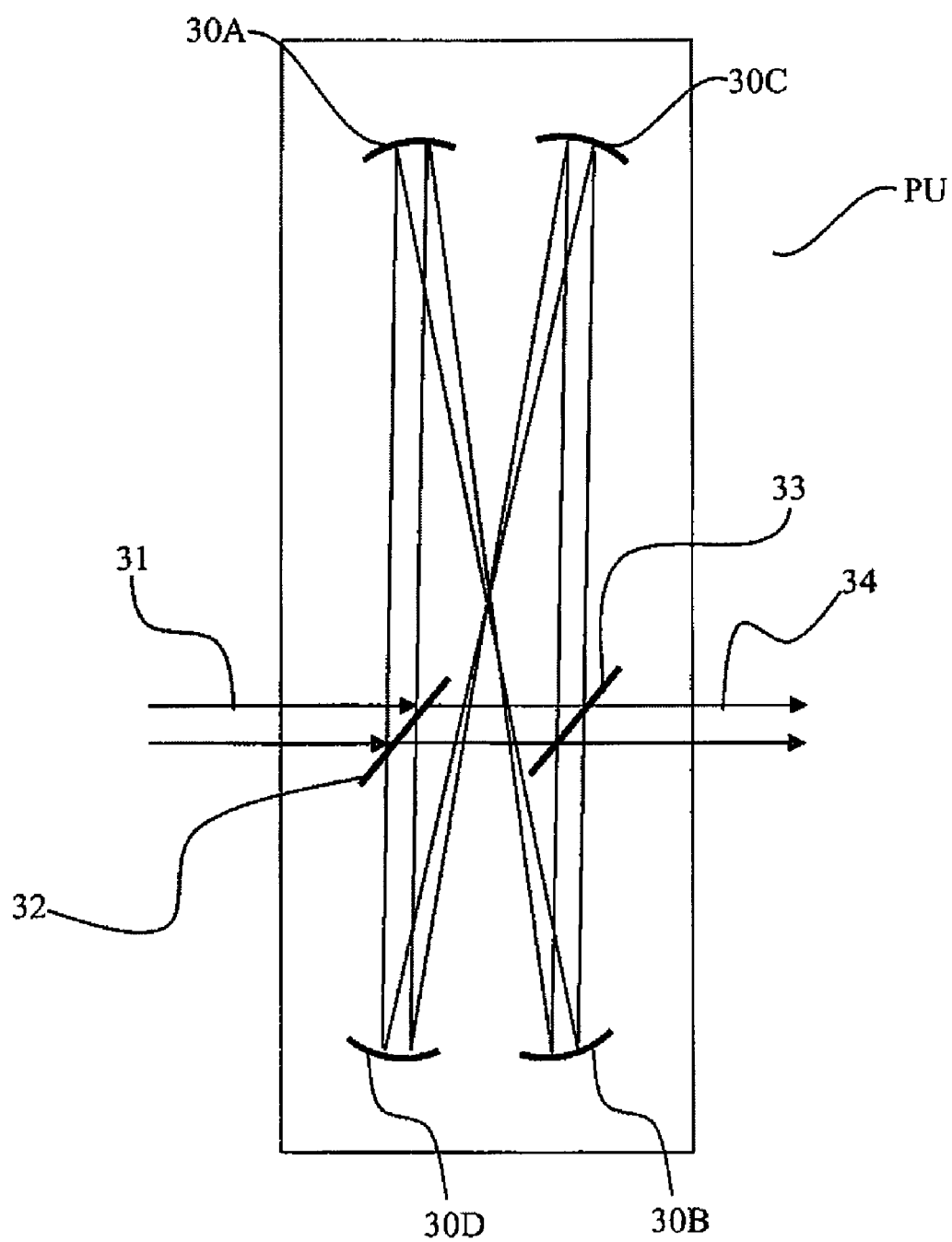
FIGS. 3 shows a pulse modifier according to an embodiment of the invention.

FIG. 3 shows a pulse modifier PU according to an embodiment of the invention. The pulse modifier comprises a first beam splitter 32 configured to receive an input pulse, a first and a second concave mirror 30A, 30B to redirect a pulse portion from the first beam splitter 32 towards a second beam splitter 33 and a first and a second cylindrical mirror 30C, 30D to redirect a further pulse portion from the second beam splitter 33 to the first beam splitter 32. The functioning of the pulse modifier according to this embodiment will be explained with reference to FIGS. 3 and 4a-e.

Figure 4:
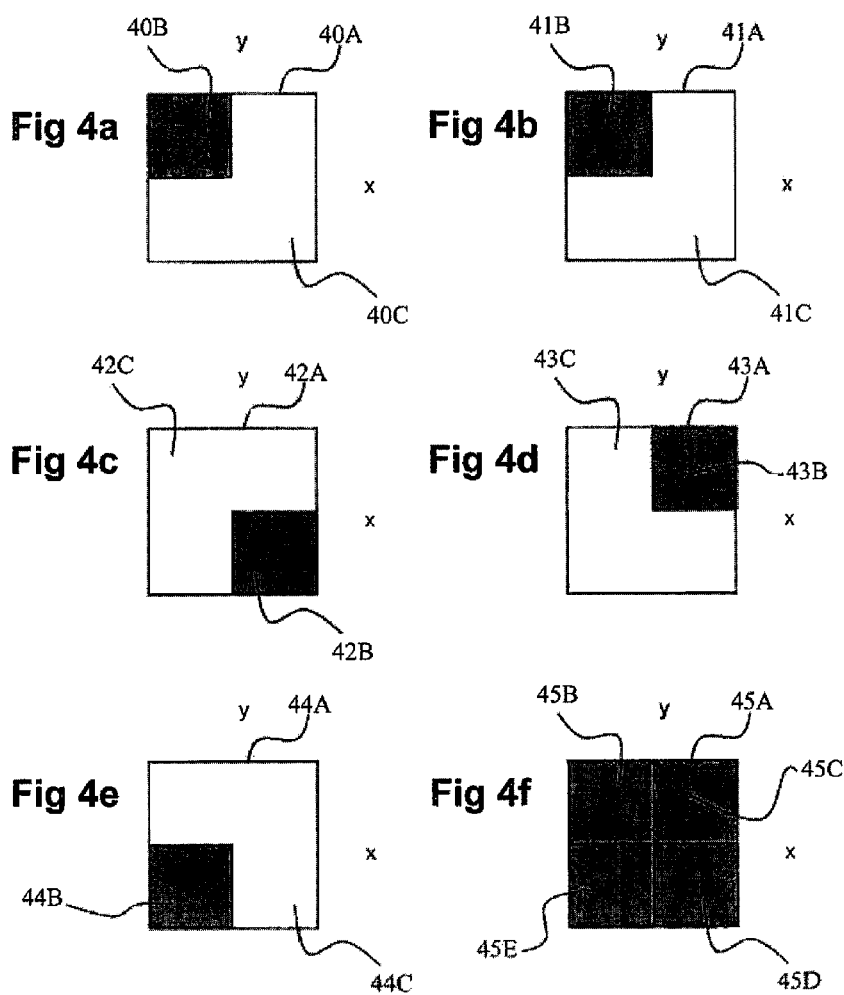
FIGS. 4a to 4f schematically show cross-sections of an input radiation beam and an output radiation beam of the pulse modifier.

In use, the pulse modifier receives an input pulse of radiation 31 from the source SO. An example intensity distribution of the cross-section of an input pulse is shown in FIG. 4a. The cross-section 40A of the input pulse schematically shows a first portion 40B of the cross-section of the input pulse having a higher intensity than the further portion 40C of the cross-section 40A of the input pulse. For illustrative purposes, in the example input pulse of FIG. 4a, the first portion forms a quadrant of the cross-section 40A. However, the non-uniform intensity distribution of the cross-section of the input pulse may have any asymmetric shape. The input pulse of radiation 31 is incident on the first beam splitter 32. The first beam splitter 32 transmits a first pulse portion towards the second beam splitter 33 and reflects a second pulse portion of the input pulse along a first delay path towards the first concave mirror 30A. The second beam splitter 33 divides the first pulse portion that was transmitted by the first beam splitter 32 into a third and a fourth pulse portion, wherein the third pulse portion is transmitted by the second beam splitter 33 and the fourth pulse portion is reflected by the second beam splitter 33 along a second delay path.

FIG. 4b shows the intensity distribution of the cross-section of the third pulse portion as it is directed out of the pulse modifier. The cross-section 41A of the third pulse portion has a similar intensity distribution as that of the input pulse. A portion 41B has a greater intensity than a further portion 41C. This is evident since the third pulse portion is the portion of the input pulse that was transmitted along the optical axis of the input pulse without being reflected or mirrored. The only substantial difference with the cross-section of the input pulse is the reduced intensity with respect to the input pulse.

As mentioned, the second pulse portion is reflected by the first beam splitter 32 along a first delay path. The first delay path comprises two concave mirrors 30A and 30B and terminates at the second beam splitter 33. The first concave mirror 30A reflects the second pulse portion towards the second concave mirror 30B, wherein the first and second concave mirrors each have identical curvatures and are arranged confocally. In an embodiment, the radius of curvature of the concave mirrors 30A and 30B are equal to the distance between the mirrors 30A and 30B, i.e. their focal length is half of this distance. In an embodiment, the distance between mirrors 30A and 30B is approximately 2000 mm. Due to the confocal arrangement of the first and second concave mirrors, the second concave mirror 30B reflects the second pulse portion wherein the cross-section of the second pulse portion is mirrored about a point of the optical axis of the pulse portion. In effect, an image of the pulse portion is inverted, i.e., mirrored about two axes or rotated 180° about the point. The mirrored second pulse portion is reflected by the second concave mirror towards the second beam splitter 33. The second beam splitter 33 divides the second pulse portion coming from the first delay path into a fifth and sixth pulse portion. The second beam splitter 33 reflects the fifth pulse portion along the optical axis of the first pulse portion to form an output radiation beam 34 with the first pulse portion, and transmits the sixth pulse portion towards the second delay path.

FIG. 4c shows the intensity distribution of the cross-section of the fifth pulse portion as it is directed out of the pulse modifier. The cross-section 42A of the fifth pulse portion has an intensity distribution that is mirrored both in the x-axis and y-axis as indicated in FIGS. 4a and 4c with respect to that of the input pulse. A portion 42B has a greater intensity than a further portion 42C. This can be understood when analyzing the effect of the first delay path on the cross-section of the second pulse portion. Traveling along the first delay path, the input pulse encounters a first reflection at the first beam splitter 32, wherein the cross-section of the pulse portion is mirrored about a first axis. Subsequently, the pulse portion is reflected at the first concave mirror 30A, causing the cross-section to be mirrored a second time along the same first axis. Next, the cross-section is mirrored about a point of the optical axis of the pulse portion due to the confocal arrangement of mirrors 30A and 30B. Next, the pulse portion is mirrored along the first axis by the second mirror 30B and second beam splitter 33. In total, the pulse portion is mirrored four times along the same first axis and mirrored one time about a point on the optical axis of the pulse portion, resulting in the intensity distribution of FIG. 4c. Again, the intensity of the cross-section of the pulse portion is reduced due to the division of the pulse portion at the first and second beam splitters.

As mentioned, the second beam splitter 33 reflects the fourth pulse portion towards the second delay path and transmits the sixth pulse portion towards the same second delay path. The second delay path comprises two cylindrical mirrors 30C and 30D and terminates at the first beam splitter 32. The first cylindrical mirror 30A reflects the fourth and sixth pulse portions towards the second cylindrical mirror 30C, wherein the first and second cylindrical mirrors have an identical curvature along a first direction and are arranged confocally. In an embodiment, the radius of curvature of the cylindrical mirrors 30C and 30D are equal to the distance between the mirrors 30C and 30D, i.e. their focal length is half of this distance. In an embodiment, the distance between mirrors 30C and 30D is approximately 2000 mm. Due to the confocal arrangement of the first and second cylindrical mirrors, the cross-sections of the fourth and sixth pulse portion are mirrored about a first axis transverse to the optical axis of the pulse portions, after being reflected by the second cylindrical mirror 30D.

Subsequently, the first beam splitter 32 divides all pulse portions originating from the fourth and sixth pulse portions into a seventh and an eighth pulse portion, wherein the first beam splitter 32 directs the seventh pulse portion along the optical axis of the output radiation beam 34 and directs the eighth pulse portion along the first delay path. The second beam splitter 33 divides the seventh pulse portion into further pulse portions, wherein a first portion of the further pulse portions is transmitted along the optical axis of the output radiation beam 34 and a second portion is reflected along the second delay path.

FIG. 4d shows the intensity distribution of the cross-section of the pulse portions 43A as transmitted by the second beam splitter 33 and originating from the fourth pulse portion. Due to the subsequent reflections at the second and first beam splitters and reflection about an axis transverse to the optical axis in between the two cylindrical mirrors 30C and 30D, the intensity distribution of the cross-section of the fourth pulse portion as transmitted by the second beam splitter 33 is mirrored in the y-axis with respect to the cross-section of the input pulse. Again, the intensity of the cross-section of the pulse portion is reduced due to the division of the pulse at the first and second beam splitters. A portion 43B has a greater intensity than a further portion 43C.

FIG. 4e shows the intensity distribution of the cross-section of the pulse portion 44A as transmitted by the second beam splitter 33 and originating from the sixth pulse portion. Due to the subsequent reflections at the first beam splitter 32 and reflections both about a point on the optical axis of the pulse portion between the concave mirrors 30A and 30B, and about an axis transverse to the optical axis of the pulse portion in between the two cylindrical mirrors 30C and 30D, the intensity distribution of the cross-section of the sixth pulse portion as transmitted by the second beam splitter is mirrored in the x-axis with respect to the cross-section of the input pulse. Again, the intensity of the cross-section of the pulse portion is reduced due to the division of the pulse at the first and second beam splitter. As shown in the figure, a portion 44B has a greater intensity than a further portion 44C.

FIG. 4f shows the intensity distribution of a cross-section 45A of the output radiation beam 34. The output radiation beam is built up out of the various pulse portions that are coupled out of the pulse modifier at the second beam splitter 33, having intensity distributions as shown in the FIG. 4b to 4e cross-sections. As is clear from FIG. 4f, the output radiation beam has an improved uniformity with respect to the input pulse, wherein the higher intensity of the first portion 40B of the input pulse is spread out over all four quadrants 45B, 45C, 45D and 45E of the cross-section of the output radiation beam.

It should be noted that, in the above, only a few paths of pulse portions through the pulse modifier are described. In practice, there are many more paths, all contributing to an improved intensity distribution over the entire cross-section of the output radiation beam.

Figure 5:
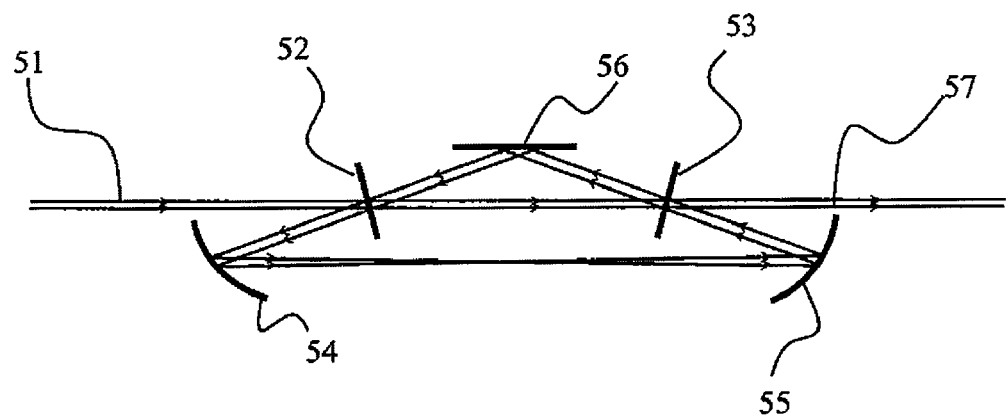
FIG. 5 shows a pulse modifier according to an embodiment of the invention.

FIG. 5 shows a pulse modifier according to an embodiment of the invention. The pulse modifier comprises a first beam splitter 52 to receive an input pulse 51, a first and a second concave mirror 54, 55 to redirect a pulse portion from the first beam splitter 52 towards a second beam splitter 53, which couples a pulse portion 57 in the direction out of the pulse modifier, and a flat mirror 56 to direct a further pulse portion from the second beam splitter 53 to the first beam splitter 52. The functioning of the pulse modifier according to this embodiment is similar to that of the embodiment described with respect to FIG. 3. As in that embodiment, the pulse modifier comprises a first and a second delay path, wherein the first delay path starts at the first beam splitter 52 and terminates at the second beam splitter 53. Likewise, the second delay path starts at the second beam splitter 53 and terminates at the first beam splitter 52. The first delay path is arranged to mirror the cross-section of the pulse portion about a first axis transverse to the optical axis of the pulse portion and the second delay path is arranged to mirror the cross-section of the pulse portion about a point of the optical axis of the pulse portions. The concave mirrors 54, 55 are identical and have radii of curvature that are circle symmetric, wherein the radius of curvature of the concave mirrors 54, 55 is equal to the distance between the mirrors 54 and 55, i.e. their focus is at half this distance. This is possible due to the relatively sharp angle at which the pulse portions are incident on the concave mirrors, causing little deformation of the pulse portions.

Figure 6:
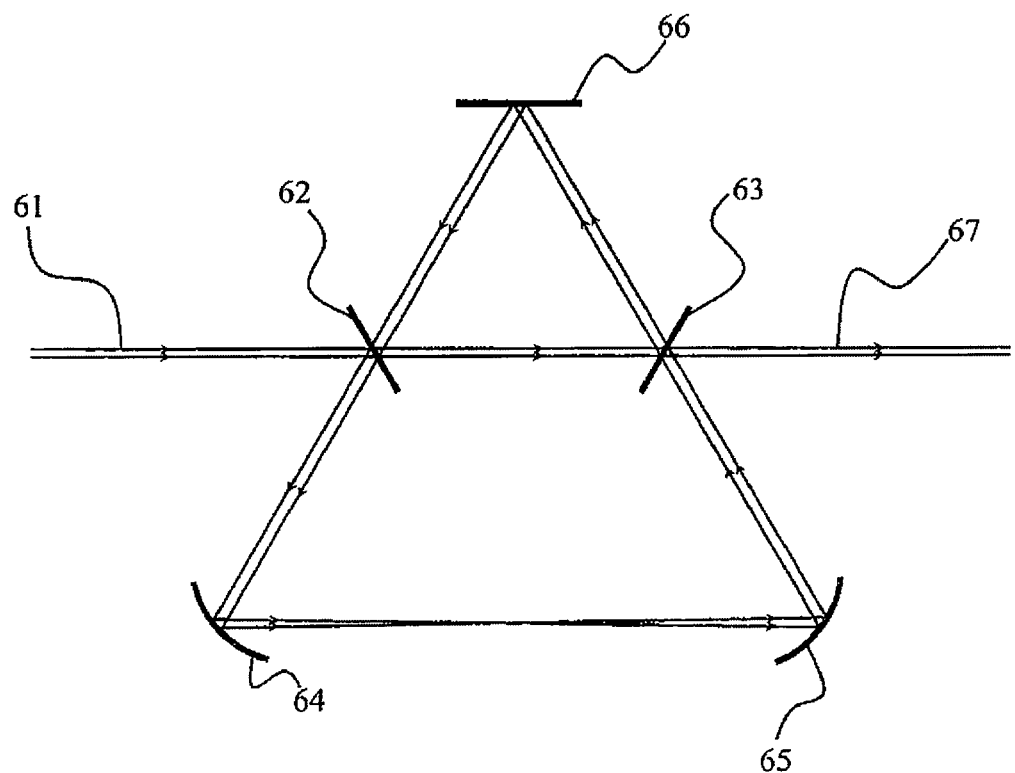
FIG. 6 shows a pulse modifier according to an embodiment of the invention.

FIG. 6 shows a pulse modifier according to an embodiment of the invention. The pulse modifier comprises a first beam splitter 62 to receive an input pulse 61, a first and a second concave mirror 64, 65 to redirect a pulse portion from the first beam splitter 62 towards a second beam splitter 63, which couples a pulse portion 67 in the direction out of the pulse modifier, and a flat mirror 66 to direct a further pulse portion from the second beam splitter 63 to the first beam splitter 62. The functioning of the pulse modifier according to this embodiment is similar to that of the embodiments described with respect to FIGS. 3 and 5. As in the previous embodiments, the pulse modifier comprises a first and a second delay path, wherein the first delay path starts at the first beam splitter 62 and terminates at the second beam splitter 63. Likewise, the second delay path starts at the second beam splitter 63 and terminates at the first beam splitter 62. The first delay path is arranged to mirror the cross-section of the pulse portion about a first axis transverse to the optical axis of the pulse portion and the second delay path is arranged to mirror the cross-section of the pulse portion about a point of the optical axis of the pulse portions. The concave mirrors 64, 65 are identical and have a first radius of curvature in a first direction and a second radius of curvature in a second direction. In an embodiment, the radius of curvature of the concave mirrors 64, 65 perpendicular to the plane of the drawing equals the distance between the mirrors 64 and 65, the radius of curvature in the plane of the drawing equaling approximately 1.2 times the distance between the mirrors 64 and 65. In an embodiment, the distance between mirrors 64 and 65 is approximately 2000 mm. This is needed to correct for a deformation of the pulse portions due to the relatively shallow angle at which the pulse portions are incident on the concave mirrors. Such a deformation may be a change in divergence and uniformity. The concave mirrors 64, 65 correct the deformation of the pulse portions by having a first focal distance along the first direction and a second focal distance along the second direction.

FIG. 7 shows a pulse modifier according to an embodiment of the invention. The pulse modifier comprises a first beam splitter 72 to receive an input pulse 71, a first and a second flat mirror 74, 75 to redirect a pulse portion from the first beam splitter 72 towards a second beam splitter 73, which couples a pulse portion 77 in the direction out of the pulse modifier, and a flat mirror 76 to direct a further pulse portion from the second beam splitter 73 to the first beam splitter 72. Furthermore, the pulse modifier comprises two positive lenses 78, 79 to mirror a cross-section of the pulse portion about a point of the optical axis of the pulse portion. The positive lenses 78, 79 are arranged confocally. The focal length of positive lenses 78, 79 may be easily calculated by the skilled person using the thick lens formula, wherein the focal length equals half the distance between the lenses 78, 79. The functioning of the pulse modifier according to this embodiment is similar to that of the previous embodiments. As in the previous embodiments, the pulse modifier comprises a first and a second delay path, wherein the first delay path starts at the first beam splitter 72 and terminates at the second beam splitter 73. Likewise, the second delay path starts at the second beam splitter 73 and terminates at the first beam splitter 72. The first delay path is arranged to mirror the cross-section of the pulse portion about a first axis transverse to the optical axis of the pulse portion and the second delay path is arranged to mirror the cross-section of the pulse portion about a point of the optical axis of the pulse portions.

In the disclosed embodiments, the first delay path is arranged to mirror a cross-section of the pulse portion about a point of the optical axis of the pulse portions and the second delay path is arranged to mirror a cross-section of the pulse portion about a first axis transverse to the optical axis of the pulse portions. In an embodiment, the second delay path may be arranged to mirror a cross-section of the pulse portion about a point of the optical axis of the pulse portions and the first delay path may be arranged to mirror a cross-section of the pulse portion about a first axis transverse to the optical axis of the pulse portions. In an embodiment, the delay paths may be arranged to mirror only a portion of the cross-section of the pulse portions.

The delay paths of the pulse modifier may be arranged in different configurations. For example, the pulse modifier may comprise a beam divider to divide an input pulse into a plurality of pulse portions, each of the pulse portions being directed into a respective delay path, wherein the delay paths may be arranged to be parallel, non-interfering paths. In this arrangement, the pulse modifier further comprises a beam combiner configured to combine the pulse portions into an output beam. A disadvantage of this arrangement is that the beam modifier according to this configuration may be less compact and require more optical elements.

In the embodiments shown, the output pulses are emitted along the same optical axis as the optical axis of the input pulses. An advantage of the output pulses being emitted along the same optical axis as the optical axis of the input pulses is that the pulse modifier may be inserted at any location in the beam delivery system without changing the direction of radiation. However, based on the embodiments of the invention disclosed, the skilled person can easily adjust the configuration of the embodiments such that the output pulses are emitted along an optical axis different from the optical axis of the input pulses.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the skilled artisan can easily employ different apparatus or methods of dividing the radiation where appropriate. Additional mirrors may be employed to change the path of radiation through the pulse modifier.

The descriptions above are intended to be illustrative, not limiting. Thus, it will be apparent to one skilled in the art that modifications may be made to the invention as described without departing from the scope of the claims set out below.

What is claimed is:

1. A pulse modifier configured to receive an input pulse of radiation and further configured to emit one or more corresponding output pulses of radiation, the pulse modifier comprising:
   a beam divider configured to divide the input pulse into a plurality of pulse portions;
   a plurality of delay paths configured to receive and delay the respective pulse portions; and
   a beam combiner configured to combine the delayed pulse portions into the one or more output pulses,
   wherein at least one delay path is arranged to mirror a portion of a cross-section of the pulse portion about a first axis transverse to the optical axis of the pulse portion and at least a further delay path is arranged to mirror a portion of a cross-section of the pulse portion about a point of the optical axis of the pulse portions.

2. The pulse modifier according to claim 1, configured to receive the input pulse of radiation along a first optical axis and further configured to emit the one or more corresponding output pulses of radiation along a second optical axis, wherein:

the beam divider comprises a first beam splitter disposed along the first optical axis and the beam combiner comprises a second beam splitter disposed along the second optical axis, a first delay path is configured to originate at the first beam splitter and terminate at the second beam splitter, a second delay path is configured to originate at the second beam splitter and terminate at the first beam splitter, the first beam splitter is configured to divide the input pulse into a first and a second pulse portion, the first beam splitter is configured to direct the first pulse portion along the second optical axis and the second pulse portion along the first delay path, the second beam splitter is configured to divide the first pulse portion into a third and a fourth pulse portion and to divide the second pulse portion into a fifth and sixth pulse portion, and the second beam splitter is configured to direct the third and fifth pulse portions along the second optical axis and the fourth and sixth pulse portions along the second delay path, the first beam splitter is configured to divide pulses from the fourth and sixth pulse portion into a seventh and an eighth pulse portion, the first beam splitter is configured to direct the seventh pulse portion along the second optical axis and to direct the eighth pulse portion along the first delay path, the first or the second delay path is arranged to mirror a portion of a cross-section of the pulse portion about a first axis transverse to the optical axis of the pulse portions, and at least a second delay path is arranged to mirror a portion of a cross-section of the pulse portion about a point of the optical axis of the pulse portions.

3. The pulse modifier according to claim 2, wherein the first optical axis coincides with the second optical axis.

4. The pulse modifier according to claim 2, wherein the first or the second delay path comprises a first and second mirror and the other of the first or the second delay path comprises a third mirror.

5. The pulse modifier according to claim 4, wherein the first and second mirrors are concave mirrors and the third mirror is a plane mirror.

6. The pulse modifier according to claim 5, wherein the first and second mirrors have a first radius of curvature in a first direction and a second radius of curvature in a second direction.

7. The pulse modifier according to claim 6, wherein the first radius of curvature is equal to the second radius of curvature.

8. The pulse modifier according to claim 2, wherein the first delay path comprises a first and second mirror and the second delay path comprises a third and fourth mirror.

9. The pulse modifier according to claim 8, wherein the first and second mirrors or the third and fourth mirrors are cylindrical mirrors.

10. The pulse modifier according to claim 1, wherein a wavelength of radiation is selected from one of the following: 365 nm, 355 nm, 248 nm, 193 nm, 157 nm, 126 nm and in the range 5-20 nm.

11. The pulse modifier according to claim 10, wherein the wavelength of radiation is 193 nm and the first and second beam splitters are substantially made of $CaF_2$.

12. The pulse modifier according to claim 1, wherein the at least a further delay path arranged to mirror a portion of a cross-section of the pulse portion about a point of the optical axis of the pulse portions is arranged to rotate the pulse portion 180° about the point.

13. A lithographic apparatus comprising a pulse modifier comprising:

a beam divider configured to divide the input pulse into a plurality of pulse portions;

a plurality of delay paths configured to receive and delay the respective pulse portions; and a beam combiner configured to combine the delayed pulse portions into the one or more output pulses, wherein at least one delay path is arranged to mirror a portion of a cross-section of the pulse portion about a first axis transverse to the optical axis of the pulse portion and at least a further delay path is arranged to mirror a portion of a cross-section of the pulse portion about a point of the optical axis of the pulse portions.

14. The lithographic apparatus according to claim 13, wherein the pulse modifier is arranged in an illumination system or a beam delivery system of the lithographic apparatus.

15. A method of modifying an input pulse of radiation, comprising:

receiving an input pulse of radiation;

dividing the input pulse into a plurality of pulse portions;

delaying the plurality of pulse portions;

combining the delayed pulse portions into one or more output pulses of radiation;

mirroring a portion of a cross-section of the pulse portion about a first axis tansverse to the optical axis of the pulse portions using a delay path; and mirroring a portion of a cross-section of the pulse portion about a point of the optical axis of the pulse portions using a further delay path.

16. The method according to claim 15, wherein mirroring a portion of a cross-section of the pulse portion about a point of the optical axis of the pulse portions comprises rotating the pulse portion 180° about the point.

* * * * *